US008000158B2

(12) United States Patent  (10) Patent No.: US 8,000,158 B2
Lee  (45) Date of Patent: Aug. 16, 2011

(54) SEMICONDUCTOR MEMORY DEVICE INCLUDING REPAIR REDUNDANCY MEMORY CELL ARRAYS

(75) Inventor: Joong-Ho Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 77 days.

(21) Appl. No.: 12/490,690

(22) Filed: Jun. 24, 2009

(65) Prior Publication Data

US 2010/0290296 A1   Nov. 18, 2010

(30) Foreign Application Priority Data

May 13, 2009 (KR) .......................... 10-2009-0041589

(51) Int. Cl.
*G11C 7/00* (2006.01)
(52) U.S. Cl. .................. 365/200; 365/201; 365/230.03; 365/230.04; 365/231; 365/233.13
(58) Field of Classification Search .................. 365/200, 365/201, 230.03, 230.04, 231, 233.13
See application file for complete search history.

(56) References Cited

U.S. PATENT DOCUMENTS

2009/0040825 A1* 2/2009 Adusumilli et al. ..... 365/185.09
* cited by examiner

*Primary Examiner* — Hoai V Ho
*Assistant Examiner* — Fernando N Hidalgo
(74) *Attorney, Agent, or Firm* — IP & T Group LLP

(57) ABSTRACT

A semiconductor memory device includes a plurality of memory cell matrixes each of which contains plural memory cell arrays whose number is lager than $2^n$ and smaller than $2^{n+1}$, n being a natural number. The semiconductor memory device includes normal memory cell arrays including $2^m$ numbers of memory cell arrays of the plurality of memory cell matrixes, m being a bit of addresses, wherein a data access operation is performed on normal memory cells in the normal memory cell arrays as normal word lines corresponding to the normal memory cells are activated in response to the addresses, and additional redundancy memory cell arrays in the plurality of memory cell matrixes, wherein repair-expected memory cells in the normal memory cell arrays are replaced with the additional redundancy memory cell arrays as redundancy word lines corresponding to the additional redundancy memory cells are activated in response to the addresses corresponding to the repair-expected memory cells.

11 Claims, 3 Drawing Sheets

FIG. 2
(PRIOR ART)

SEMICONDUCTOR MEMORY DEVICE INCLUDING REPAIR REDUNDANCY MEMORY CELL ARRAYS

CROSS-REFERENCE TO RELATED APPLICATIONS

The present application claims priority of Korean Patent Application No. 10-2009-0041589, filed on May 13, 2009, the disclosure of which is incorporated herein by reference in its entirety.

BACKGROUND OF THE INVENTION

The present invention relates to semiconductor design technology, and more particularly, to a semiconductor memory device performing a data access operation by replacing a repair-expected memory cell among normal memory cells with a normal redundancy memory cell.

In general, as a degree of integration of a semiconductor memory device such as a double data rate synchronous dynamic random access memory (DDR SDRAM) device is increasing rapidly, tens of millions of memory cells are being included in one semiconductor memory device. These memory cells construct a memory cell array where the memory cells are uniformly arranged and a group of memory cell arrays is referred to as a memory cell matrix. The semiconductor memory device includes a plurality of memory cell matrixes.

If even one of the memory cells is failed, the semiconductor memory device may not perform a desired operation. However, as the technology of fabricating the semiconductor memory device is being developed, a small amount of memory cells is only failed stochastically and thus it may be very ineffective to dispose the semiconductor memory device as a defective product by the failure of few memory cells when considering the product yield. In order to make up for the failure, separately designed redundancy memory cells are further employed in the semiconductor memory device in addition to normal memory cells. Therefore, if normal memory cells are failed, the failed normal memory cells are replaced with the redundancy memory cells. Hereinafter, a memory cell of the normal memory cells that is failed and thus should be replaced with a redundancy memory cell is referred to as 'a repair-expected memory cell'.

Meanwhile, a memory cell structure of the semiconductor memory device can be classified into a folded bit line structure and an open bit line structure and they have following differences.

First of all, the folded bit line structure includes a bit line, e.g., a positive bit line, where data is driven and a bit line, e.g., a negative bit line, that is a standard when performing an amplifying operation on the data, wherein the positive bit line and the negative bit line are disposed in the same memory cell matrix on the basis of a bit line sense amplifier disposed in a core region of the semiconductor memory device. Therefore, the same noise is reflected on the positive bit line and the negative bit line and these noises offset each other. Through this offset operation, the folded bit line structure guarantees a stable operation against the noise. In the meantime, the open bit line structure includes a positive bit line and a negative bit line that are disposed in different memory cell matrixes on the basis of a bit line sense amplifier. Therefore, a noise occurring in the positive bit line is different from that occurring in the negative bit line and thus the open bit line structure may be weak to the noise.

Furthermore, while a unit memory cell in the folded bit line structure is designed in the structure of 8F2, a unit memory cell in the open bit line structure is designed in the structure of 6F2. The unit memory cell structure becomes a factor of determining the size of the semiconductor memory device. Accordingly, for the same amount of data storage, a semiconductor memory device having the open bit line structure can be designed smaller in size than a semiconductor memory device having the folded bit line structure.

FIG. 1 illustrates a cell array structure of a conventional semiconductor memory device.

Referring to FIG. 1, the semiconductor memory device includes normal memory cell arrays 110 and 130 where a plurality of memory cells is arranged. For illustration purposes, an upper part on the basis of a bit line sense amplifying block (SA) 170 is referred to as an even memory cell matrix and a lower part on the basis of the bit line sense amplifying block 170 is referred to as an odd memory cell matrix.

The even memory cell matrix and the odd memory cell matrix include a plurality of word lines (WL) corresponding to the memory cell arrays, respectively. Therefore, one corresponding word line is activated in a data access operation, e.g., a reading/writing operation. Each of bit line sense amplifiers included in the bit line sense amplifying block 170 is connected to a corresponding positive bit line BLT and a corresponding negative bit line BLB, and senses and amplifies a voltage level difference of the positive bit line BLT and the negative bit line BLB. The amplified data are transferred through local input/output lines LIO(T/B)0 and LIO(T/B)2.

For the reference, a bit line sense amplifying block (not shown) playing the same role as the bit line sense amplifying block 170 does is disposed at an upper side of the even memory cell matrix, and the negative bit line BLB disposed in the even memory cell matrix is connected to the bit line sense amplifying block disposed at the upper side of the even memory cell matrix. Moreover, a bit line sense amplifying block (not shown) is also disposed at a lower side of the odd memory cell matrix, and the positive bit line BLT disposed in the odd memory cell matrix is connected to the bit line sense amplifying block disposed at the lower side of the odd memory cell matrix.

Hereinafter, a data access operation will be roughly described with reference to the cell array structure of FIG. 1.

In the data access operation, if one word line WL is activated, a normal memory cell array corresponding to the activated word line WL is actuated. That is, each normal memory cell corresponding to the activated word line WL is actuated and data stored in the actuated normal memory cell is transferred to a corresponding bit line.

If a word line WL disposed in the even memory cell matrix is activated, data stored in each normal memory cell connected to the activated word line WL is transferred to the bit line sense amplifying block 170 through the positive bit line BLT, wherein the negative bit line BLB disposed in the odd memory cell matrix is used as a reference bit line when sensing and amplifying the data transferred through the positive bit line BLT. Meanwhile, if a word line WL disposed in the odd memory cell matrix is activated, data stored in each normal memory cell connected to the activated word line WL is transferred to the bit line sense amplifying block 170 through the negative bit line BLB, wherein the positive bit line BLT disposed in the even memory cell matrix is used as a reference bit line when sensing and amplifying the data transferred through the negative bit line BLB.

In the even memory cell matrix, logical data may have the same polarity as that of physical data. That is, a memory cell connected to the positive bit line BLT of the even memory cell matrix physically stores a value corresponding to a logic high to store logical data of a logic high and a value corresponding to a logic low to store logical data of a logic low. On the other hand, in the odd memory cell matrix, the polarity of logical data is different from that of physical data. That is, a memory cell connected to the negative bit line BLB of the odd memory cell matrix physically stores a value corresponding to a logic low to store logical data of a logic high and a value corresponding to a logic high to store logical data of a logic low.

In the meantime, redundancy memory cell arrays 150 are prepared to be replaced with repair-expected memory cells that may occur in the normal memory cell arrays 110 and 130 and each of the redundancy memory cell arrays 150 is connected to a redundancy word line RWL. As described above, the redundancy memory cell arrays 150 are designed separately from the normal memory cell arrays 110 and 130 and thus they are not included in a memory cell matrix. Herein, as one example, the redundancy memory cell arrays 150 are designed to have a structure similar to those of the even memory cell matrix. Therefore, in the redundancy memory cell arrays 150, logical data has the same polarity as that of physical data, which is a characteristic of the even memory cell matrix.

Hereinafter, an operation of repairing a repair-expected memory cell will be described with reference to the structure of FIG. 1. For illustration purposes, it is assumed that the normal memory cell arrays 110 and 130 include repair-expected memory cells.

In the data access operation, if addresses corresponding to the repair-expected memory cell are coupled thereto, the semiconductor memory device does not activate a word line WL corresponding to the addresses but activate a redundancy word line RWL corresponding to the addresses. Therefore, the data access operation corresponding to the addresses is performed in the redundancy memory cells included in the redundancy memory cell arrays 150 that operate normally instead of the repair-expected memory cells included in the normal memory cell arrays 110 and 130. In other words, in the conventional semiconductor memory device, in case the even memory cell matrix and the odd memory cell matrix include the repair-expected memory cells, each of the repair-expected memory cells is replaced with a corresponding one of the redundancy memory cell arrays 150 (as denoted by using arrows with dot lines).

Meanwhile, the semiconductor memory device performs various tests before the shipment thereof. Among those tests, there is a disturb test of providing stress to a memory cell.

FIG. 2 illustrates a view of explaining data coupled to a memory cell in the disturb test.

Referring to FIG. 2, in the disturb test, '0' data corresponding to a logic low is inputted to a test-target memory cell and '1' data corresponding to a logic high is inputted to memory cells adjacent to the test-target memory cell. Therefore, the test-target memory cell where the '0' data is coupled is stressed by the '1' data coupled to the adjacent memory cells thereof.

Referring back to FIG. 1, the disturb test is performed by sequentially supplying a data pattern such as that in FIG. 2 to the memory cell array. The normal memory cell arrays 110 of the even memory cell matrix and the normal memory cell arrays 130 of the odd memory cell matrix do not have any difficulties when performing the disturb test. However, in case of the redundancy memory cell arrays 150, the disturb test may not be performed therein. For instance, in the disturb test where the data pattern such as that in FIG. 2 should be provided, the redundancy memory cell array to be repaired corresponding to the odd memory cell matrix should be provided with data having the polarity opposite to that of the odd memory cell matrix. In this case, it may be difficult to perform the disturb test with a desired data pattern. Therefore, although the redundancy memory cell arrays 150 are designed weak to the stress, it may not be detected. As a result, in case the repair-expected memory cell should be replaced with the redundancy memory cell, it may be difficult to secure a smooth data access operation. That is, there may be a problem of degrading the reliability of the semiconductor memory device.

SUMMARY OF THE INVENTION

An embodiment of the present invention is directed to providing a semiconductor memory device capable of replacing repair-expected memory cells using dummy memory cell arrays.

Another embodiment of the present invention is directed to providing a semiconductor memory device capable of replacing a repair-expected memory cell of an even memory cell matrix and that of an odd memory cell matrix with a redundancy memory cell in arrays different from each other.

In accordance with an aspect of the present invention, there is provided a semiconductor memory device including a plurality of memory cell matrixes each of which contains a multiplicity of memory cell arrays whose number is lager than $2^n$ and smaller than $2^{n+1}$, n being a natural number, the semiconductor memory device including: normal memory cell arrays including $2^m$ numbers of memory cell arrays of the plurality of memory cell matrixes, m being a bit of addresses, wherein a data access operation is performed on a normal memory cell in the normal memory cell arrays as a normal word line corresponding to the normal memory cell is activated in response to the addresses; and additional redundancy memory cell arrays included in the plurality of memory cell matrixes, wherein a first repair-expected memory cell in the normal memory cell arrays is replaced with an additional redundancy memory cell included in the additional redundancy memory cell arrays as a redundancy word line corresponding to the additional redundancy memory cell is activated in response to the addresses corresponding to the first repair-expected memory cell.

In accordance with another aspect of the present invention, there is provided a semiconductor memory device including: first and second memory cell matrixes each of which includes a multiplicity of memory cell arrays whose number is lager than $2^n$ and smaller than $2^{n+1}$, n being a natural number; a first redundancy memory cell array not included in the first and second memory cell matrixes, wherein a first repair-expected memory cell in the first memory cell matrixes is replaced with a first redundancy memory cell included in the first redundancy memory cell array in response to addresses corresponding to the first repair-expected memory cell; and a second redundancy memory cell array included in the second memory cell matrix, wherein a second repair-expected memory cell in the second memory cell matrix is replaced with a second redundancy memory cell in the second redundancy memory cell array in response to addresses corresponding to the second repair-expected memory cell.

Since the present invention replaces the repair-expected memory cells using the dummy memory cell arrays that were not used in the prior art, much larger numbers of repair-expected memory cells can be replaced with normal redundancy memory cells. Furthermore, by replacing the repair-expected memory cell occurring in the even memory cell matrix and the repair-expected memory cell occurring in the odd memory cell matrix with the redundancy memory cell in the different arrays, it is possible to perform a disturb test on the replaced redundancy memory cells.

BRIEF DESCRIPTION OF THE DRAWINGS

FIG. 2 illustrates a view of explaining data coupled to a memory cell in a disturb test.

DESCRIPTION OF SPECIFIC EMBODIMENTS

Other objects and advantages of the present invention can be understood by the following description, and become apparent with reference to the embodiments of the present invention.

The present invention can replace a repair-expected memory cell using a memory cell array that is not used in an open bit line structure. In general, the unused memory cell array is referred to as a dummy memory cell array. Before describing the present invention, the dummy memory cell array will be explained.

A semiconductor memory device stores data or outputs data according to, e.g., a command of a central processing unit (CPU). Namely, in case the CPU requires a data access operation, a word line corresponding to row addresses is activated and signals corresponding to column addresses are enabled, so that the data access operation is performed on a memory cell corresponding to the row addresses and the column addresses. Herein, although the number of word lines may be changed according to a semiconductor memory device, it typically corresponds to an address bit. That is, since word lines are designed corresponding to $2^m$ units in case the address bit is m, the number of word lines corresponding to one memory cell matrix is designed to be 256, 512 and so on corresponding to the $2^m$ units. At this point, all of the word lines included in a plurality of memory cell matrixes are $2^m$ units and the number of word lines corresponds to the number of memory cell arrays.

However, in case of the open bit line structure, the number of word lines corresponding to one memory cell matrix is designed to become 320, 384, 420 and so on, which is lager than $2^n$ and smaller than $2^{n+1}$, when considering an operational margin of a bit line sense amplifier, noise and design efficiency, wherein n and m are natural numbers. Therefore, compared to a folded bit line structure with word lines of $2^m$ units, unused memory cell arrays, i.e., dummy memory cell arrays, occur in the open bit line structure. Herein, the dummy memory cell arrays are included in a memory cell matrix and they are a part designed over $2^m$ numbers of memory cell arrays. Therefore, in the prior art, word lines attached to the dummy memory cell arrays are connected to a ground voltage (VSS) terminal and thus the dummy memory cell arrays are not used.

The present invention replaces a repair-expected memory cell using such a dummy memory cell array. Therefore, for illustration purposes, the dummy memory cell array is referred to as 'an additional redundancy memory cell array' and an existing redundancy memory cell array is referred to as 'a fundamental redundancy memory cell array'.

Figure 1:
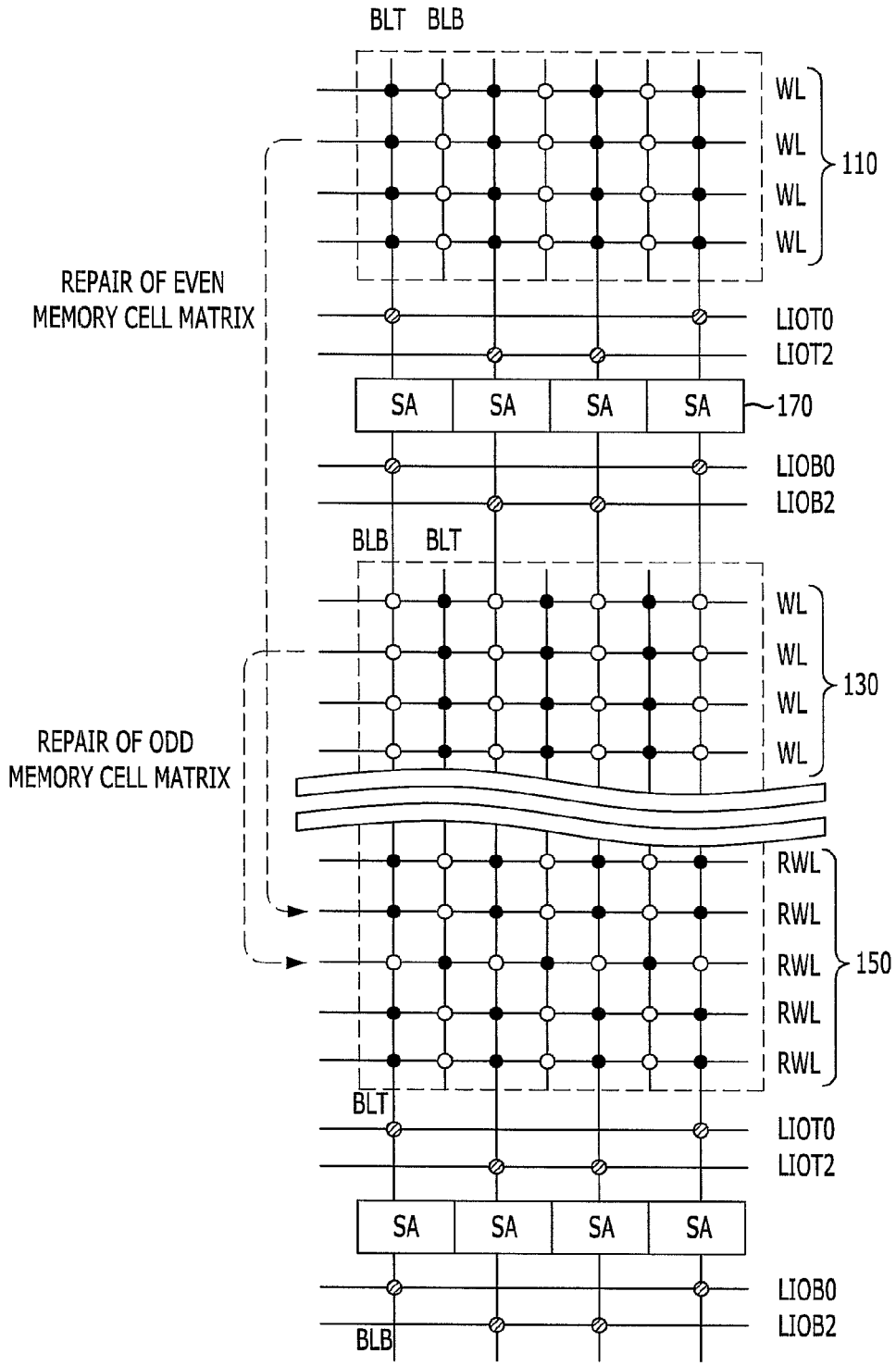
FIG. 1 illustrates a cell array structure of a conventional semiconductor memory device.
Figure 3:
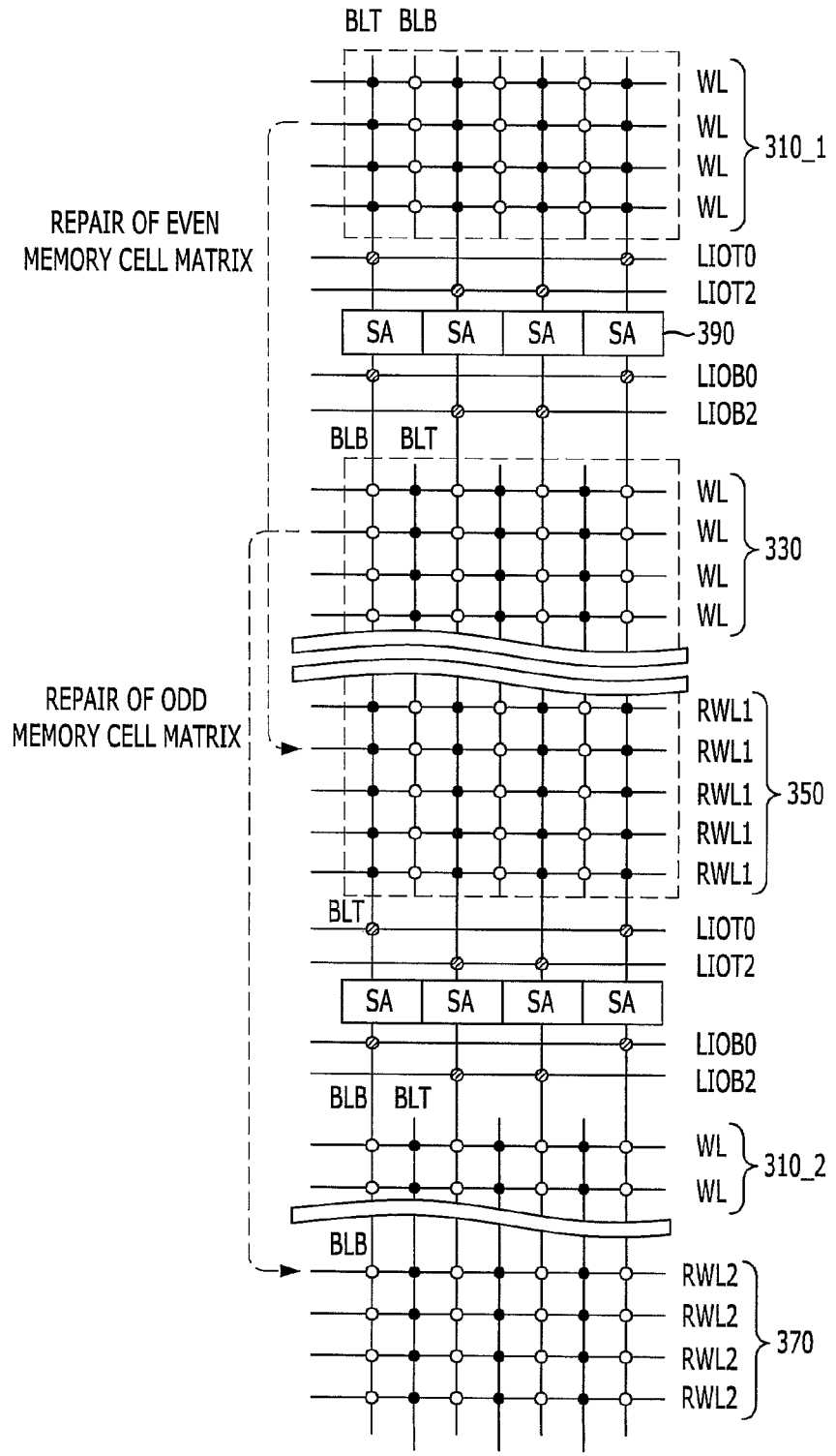
FIG. 3 illustrates a cell array structure of a semiconductor memory device in accordance with an embodiment of the present invention.

FIG. 3 illustrates a cell array structure of a semiconductor memory device in accordance with an embodiment of the present invention. Referring to FIG. 3, the semiconductor memory device includes normal memory cell arrays 310_1, 310_2 and 330, where a plurality of memory cells is arranged, fundamental redundancy memory cell arrays 350, additional redundancy memory cell arrays 370 and a bit line sense amplifying block (SA) 390.

Herein, when classifying the memory cell arrays into memory cell matrixes, the normal memory cell arrays 310_1 become one even memory cell matrix, wherein one memory cell matrix is constructed with a plurality of memory cell arrays whose number is larger than $2^n$ and smaller than $2^{n+1}$, e.g., 320, 384, 420 and so on. The normal memory cell arrays 330 become one odd memory cell matrix. The normal memory cell arrays 310_2 and the additional redundancy memory cell arrays 370 become another odd memory cell matrix. The fundamental redundancy memory cell arrays 350 are not included in a memory cell matrix and, for example, designed in an area corresponding to an even memory cell matrix.

In accordance with the present invention, repair-expected memory cells occurring in the normal memory cell arrays 310_1 corresponding to the even memory cell matrix and repair-expected memory cells occurring in the normal memory cell arrays 330 corresponding to the odd memory cell matrix can be replaced with redundancy memory cells of different memory cell arrays, i.e., the fundamental redundancy memory cell arrays 350 and the additional redundancy memory cell arrays 370, respectively. As described above, the fundamental memory cell arrays 350 are equivalent to existing used redundancy memory cell arrays and not included in a memory cell matrix. The additional redundancy memory cell arrays 370 are equivalent to existing unused dummy cell arrays and included in a memory cell matrix.

Hereinafter, an operation of repairing a repair-expected memory cell will be described with reference to the structure of FIG. 3. For illustration purposes, it is assumed that the normal memory cell arrays 310_1 included in the even memory cell matrix and the normal memory cell arrays 330 included in the odd memory cell matrix contain repair-expected memory cells.

In accordance with the present invention, the repair-expected memory cell in the normal memory cell array 310_1 corresponding to the even memory cell matrix is replaced with the fundamental redundancy memory cell array 350 corresponding to an even memory cell matrix, and the repair-expected memory cell in the normal memory cell array 330 corresponding to the odd memory cell matrix is replaced with the additional redundancy memory cell array 370 corresponding to an odd memory cell matrix.

Accordingly, in a data access operation, if addresses corresponding to the repair-expected memory cell in the even memory cell matrix are inputted thereto, the semiconductor memory device activates a fundamental redundancy word line RWL1 of the fundamental redundancy memory cell array 350 instead of a word line WL of the even memory cell matrix. On the other hand, if addresses corresponding to the repair-expected memory cell in the odd memory cell matrix are inputted thereto, the semiconductor memory device activates an additional redundancy word line RWL2 of the additional redundancy memory cell array 370 instead of a word line WL of the odd memory cell matrix. That is, the present invention replaces the repair-expected memory cell with a memory cell array having the same polarity as that of the repair-expected memory cell. In case the repair-expected memory cell is replaced with the memory cell array having the same polarity, it is possible to perform a disturb test on the fundamental redundancy memory cell arrays 350 and the additional redundancy memory cell arrays 370.

Herein, the additional redundancy word line RWL2 is activated in response to the addresses corresponding to the repair-expected memory cell. Therefore, it is preferable that the present invention employs a driver (not shown) for activating the additional redundancy word line RWL2. This driver may be designed to have a structure similar to that of a driver for activating the fundamental redundancy word line RWL1.

In the prior art, the existing redundancy memory cell array could be replaced with any one of the repair-expected memory cell occurring in the even memory cell matrix and the repair-expected memory cell occurring in the odd memory cell matrix, so that it may be difficult to perform the disturb test on the existing redundancy memory cell arrays. However, in the semiconductor memory device in accordance with the present invention, the repair-expected memory cells occurring in the normal memory cell arrays 310_1 and 310_2 of the even memory cell matrix can be replaced with the fundamental redundancy memory cell arrays 350 having the same polarity as that of the even memory cell matrix, and the repair-expected memory cells occurring in the normal memory cell arrays 330 of the odd memory cell matrix can be replaced with the additional redundancy memory cell arrays 370 having the same polarity as that of the odd memory cell matrix.

In other words, the fundamental redundancy memory cell arrays 350 are provided with data having the same polarity as that of the normal memory cell arrays 310_1 and 310_2 corresponding to the even memory cell matrix after the repair operation, and the additional redundancy memory cell arrays 370 are provided with data having the same polarity as that of the normal memory cell arrays 330 corresponding to the odd memory cell matrix after the repair operation. This means that data having the same polarities as those of the normal memory cell arrays that are repaired are provided to the fundamental redundancy memory cell arrays 350 and the additional redundancy memory cell arrays 370, respectively. This may be also applied to the disturb test.

Hereinafter, an operation of the disturb test will be described with reference to the structure of FIG. 3. In accordance with the present invention, the fundamental redundancy memory cell arrays 350 are repaired corresponding to the even memory cell matrix and the additional redundancy memory cell arrays 370 are repaired corresponding to the odd memory cell matrix.

Figure 2:
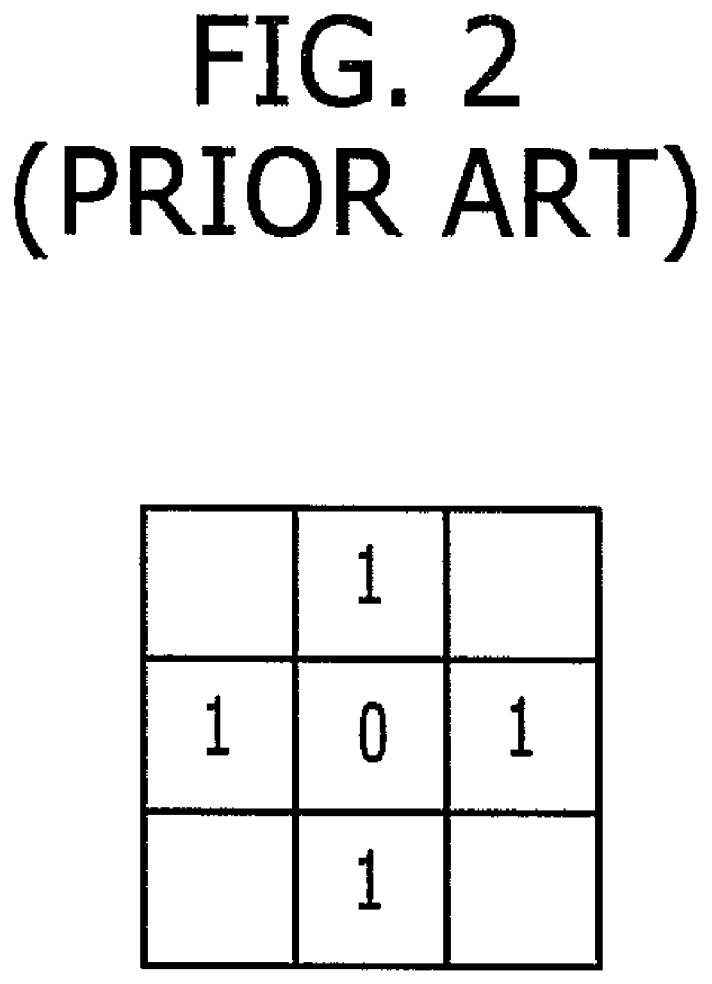

First of all, in order to perform the disturb test with the data pattern shown in FIG. 2, all of the normal memory cell arrays 310_1, 310_2 and 330 are provided with '1' data. At this time, since the fundamental redundancy memory cell arrays 350 correspond to the normal memory cell arrays 310_1 and 310_2 included in the even memory cell matrixes, '1' data are provided thereto. Meanwhile, since the additional redundancy memory cell arrays 370 correspond to the normal memory cell arrays 330 included in the odd memory cell matrix, '1' data are also provided thereto.

After then, in case '0' data are provided to the test-expected memory cells, the data pattern described in FIG. 2 is coupled to the fundamental redundancy memory cell arrays 350 and the additional redundancy memory cell arrays 370. Accordingly, it is possible to perform the disturb test.

As described above, the semiconductor memory device in accordance with the present invention can replace the repair-expected memory cells occurring in the normal memory cell arrays 310_1, 310_2 and 330 corresponding to the even and odd memory cell matrixes with the fundamental redundancy memory cell arrays 350 and the additional redundancy memory cell arrays 370, respectively. Herein, the additional redundancy memory cell arrays 370 are the dummy memory cell arrays and using the dummy memory cell arrays as the additional redundancy memory cell arrays 370 means that a number of existing repair-expected memory cells can be replaced with normal redundancy memory cells.

Moreover, since the semiconductor memory device in accordance with the present invention performs the repair operation using the fundamental redundancy memory cell arrays 350 and the additional redundancy memory cell arrays 370 having the same characteristics as those of the even memory cell matrix and the odd memory cell matrix, respectively, by classifying the even memory cell matrix and the odd memory cell matrix, it is possible to perform the disturb test by providing a desired data pattern to the fundamental redundancy memory cell arrays 350 and the additional redundancy memory cell arrays 370. Besides, the semiconductor memory device can be repaired based on the test results and thus the reliability of the semiconductor memory device can be enhanced.

In accordance with the present invention, by replacing the repair-expected memory cells with the dummy memory cell arrays that was not used in the prior art, much more repair-expected memory cells can be replaced with normal redundancy memory cell arrays.

In addition, in accordance with the present invention, since it is possible to perform the disturb test on the redundancy memory cell arrays that are replaced with the repair-expected memory cells, it is possible to enhance the reliability of the semiconductor memory device.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
   a plurality of memory cell matrixes, each of which contains a multiplicity of memory cell arrays whose number is larger than $2^n$ and smaller than $2^{n+1}$, n being a natural number, the multiplicity of memory cell arrays comprising $2^m$ normal memory cell arrays, m being a number of bits of an address, wherein a data access operation is performed on a normal memory cell in the normal memory cell arrays as a normal word line corresponding to the normal memory cell is activated in response to the address, and $2^{n+1}-2^m$ dummy cell arrays; and
   redundancy memory cell arrays for use in a repair operation,
   wherein a first repair-expected memory cell in the normal memory cell arrays is replaced with a dummy cell included in the dummy cell arrays as a redundancy word line corresponding to the dummy cell is activated in response to an address corresponding to the first repair-expected memory cell,
   wherein a second repair-expected memory cell in the normal memory cell arrays is replaced with a redundancy memory cell included in the redundancy memory cell arrays in response to an address corresponding to the second repair-expected memory cell, and
   wherein the first repair-expected memory cell and the second repair-expected memory cell are disposed on the basis of a bit line sense amplifier.

2. The semiconductor memory device of claim 1, wherein the plurality of memory cell matrixes includes an open bit line structure.

3. A semiconductor memory device, comprising:
   a plurality of memory cell matrixes. each of which contains a multiplicity of memory cell arrays whose number is larger than $2^n$ and smaller than $2^n$, n being a natural number. comprising first and second memory cell matrixes including $2^m$ memory cell arrays of the plurality of memory cell matrixes, m being a number of bits of an address, the first memory cell matrix and the second memory cell matrix being disposed on the basis of a bit line sense amplifier, and $2^{n+1}-2^m$ dummy cell arrays of the plurality of memory cell matrixes; and redundancy memory cell arrays for use in a repair operation, wherein a first repair-expected memory cell in the first memory cell matrix is replaced with a redundancy memory cell included in the redundancy memory cell arrays in response to an address corresponding to the first repair-expected memory cell, and, wherein a second repair-expected memory cell in the second memory cell matrix is replaced with a dummy memory cell in the dummy cell arrays in response to an address corresponding to the second repair-expected memory cell.

4. The semiconductor memory device of claim 3, wherein a data access operation is performed on a normal memory cell in first and second memory cell matrixes as a normal word line corresponding to the normal memory cell in the first and second memory cell matrixes is activated in response to the address.

5. The semiconductor memory device of claim 4, wherein the redundancy memory cell arrays are provided with data having the same polarity as that of data provided to the normal memory cell in the first memory cell matrixes.

6. The semiconductor memory device of claim 4, wherein the dummy cell arrays are provided with data having the same polarity as that of data provided to the normal memory cell in the second memory cell matrixes.

7. The semiconductor memory device of claim 3, wherein the first and second memory cell matrixes have an open bit line structure.

8. A method for repairing memory cell arrays in a semiconductor memory device, the semiconductor memory device including a plurality of memory cell matrixes, each of which contains a multiplicity of memory cell arrays whose number is larger than $2^n$ and smaller than $2^{n+1}$, n being a natural number, and redundancy memory cell arrays for use in a repair operation, the plurality of memory cell matrixes comprising normal memory cell arrays including $2^m$ memory cell arrays of the plurality of memory cell matrixes, m being a number of bits of an address, and dummy cell arrays including $2^{n+1}-2^m$ memory cell arrays of the plurality of memory cell matrixes, and the normal cell arrays being divided into even memory cell matrixes and odd memory cell matrixes, the even memory cell matrixes and the odd memory cell matrixes being disposed in different memory cell matrixes of the normal memory cell arrays on the basis of a bit line sense amplifier, the method comprising:

replacing a first repair-expected memory cell in the normal memory cell arrays with a memory cell included in the dummy cell arrays; and replacing a second repair-expected memory cell in the normal memory cell arrays with a memory cell included in the redundancy cell arrays, wherein the first repair-expected memory cell is included in one of even and odd memory cell matrixes, and the second repair-expected memory cell is included in the other of even and odd memory cell matrixes.

9. The method of claim 8, wherein the memory cell matrixes have an open bit line structure.

10. The method of claim 9, wherein the redundancy memory cell arrays are provided with data having the same polarity as that of data provided to the normal memory cell in the even memory cell matrixes.

11. The method of claim 9, wherein the dummy cell arrays are provided with data having the same polarity as that of data provided to the normal memory cell in the odd memory cell matrixes.

* * * * *